United States Patent
Barbour et al.

(10) Patent No.: US 7,550,960 B2
(45) Date of Patent: Jun. 23, 2009

(54) METHOD AND APPARATUS FOR MEASURING VOLTAGE IN A POWER SWITCHING DEVICE

(75) Inventors: Erskine R. Barbour, Benson, NC (US); Mietek T. Glinkowski, Raleigh, NC (US)

(73) Assignee: ABB Technology AG, Zurich (CH)

( * ) Notice: Subject to any disclaimer, the term of this patent is extended or adjusted under 35 U.S.C. 154(b) by 293 days.

(21) Appl. No.: 11/157,595

(22) Filed: Jun. 21, 2005

(65) Prior Publication Data

US 2005/0280423 A1   Dec. 22, 2005

Related U.S. Application Data

(60) Provisional application No. 60/581,451, filed on Jun. 21, 2004.

(51) Int. Cl.
G01R 31/02 (2006.01)
(52) U.S. Cl. .................... 324/72.5; 324/658; 324/76.11; 324/117 R
(58) Field of Classification Search ................ 324/72.5, 324/551, 658, 76.11, 117 R
See application file for complete search history.

(56) References Cited

U.S. PATENT DOCUMENTS

| | | | |
|---|---|---|---|
| 2,327,774 A | 8/1943 | Dickson | |
| 2,947,958 A | 8/1960 | Marks | |
| 3,222,625 A | 12/1965 | Ledocq | |
| 3,380,009 A | 4/1968 | Miller | |
| 3,729,675 A * | 4/1973 | Vosteen | 324/72 |
| 3,851,287 A | 11/1974 | Miller et al. | |
| 3,939,412 A | 2/1976 | Hermstein | |
| 4,074,193 A | 2/1978 | Kohler | |
| 4,241,373 A * | 12/1980 | Mara et al. | 361/92 |
| 4,316,254 A * | 2/1982 | Levin | 702/72 |
| 4,611,191 A * | 9/1986 | Souchere | 336/84 R |
| 4,804,908 A * | 2/1989 | Mitchell | 324/115 |
| 4,963,819 A | 10/1990 | Clarke et al. | |
| 4,999,570 A * | 3/1991 | Ehrler | 324/96 |
| 5,107,201 A * | 4/1992 | Ogle | 324/72.5 |
| 5,432,438 A * | 7/1995 | Baumgartner et al. | 324/127 |
| 5,471,144 A * | 11/1995 | Meyer | 324/551 |
| 6,344,959 B1 | 2/2002 | Milazzo | |
| 6,489,782 B1 * | 12/2002 | Baier et al. | 324/551 |
| 6,529,013 B2 * | 3/2003 | Skendzic et al. | 324/628 |
| 6,717,395 B2 * | 4/2004 | Skendzic et al. | 324/117 R |
| 6,888,086 B2 | 5/2005 | Daharsh et al. | |
| 6,965,199 B2 * | 11/2005 | Stoner et al. | 313/574 |

OTHER PUBLICATIONS

PCT Search Report, Oct. 24, 2005.

* cited by examiner

*Primary Examiner*—Vincent Q Nguyen
(74) *Attorney, Agent, or Firm*—Michael C. Prewitt; Bryan A. Shang

(57) ABSTRACT

A method and apparatus for determining a voltage potential in a power switching device. The method and apparatus uses a conductive shield surrounding a coil positioned around a connector in a power switching device. The coil is used to provide a current measuring device within the power switching device. The combination of the shield, connector and the dielectric between them forms a capacitor, which is the high voltage leg of a capacitive voltage divider circuit. The capacitive voltage divider has a low voltage leg made of one or more capacitors. The capacitors of the low voltage leg may be removed in order to adjust the output of the capacitive voltage divider. The output of the voltage divider circuit is measured, converted and displayed to a user.

16 Claims, 4 Drawing Sheets

METHOD AND APPARATUS FOR MEASURING VOLTAGE IN A POWER SWITCHING DEVICE

CROSS REFERENCE TO RELATED APPLICATION

This application claims the priority of U.S. provisional patent application Ser. No. 60/581,451 filed on Jun. 21, 2004, entitled "Voltage Measuring Using Shield Capacitance," the contents of which are relied upon and incorporated herein by reference in their entirety, and the benefit of priority under 35 U.S.C. 119(e) is hereby claimed

FIELD OF THE INVENTION

The present invention relates to a power switching device and more particularly to a method of measuring voltage potential levels in a power switching device.

BACKGROUND OF THE INVENTION

In the power generation and distribution industry, utility companies generate and distribute electricity to customers. To facilitate the process of distributing electricity, various types of power switching devices are used. In a distribution circuit, electricity flows through the power switching devices from a power generation source (a substation or the like) to the consumer. When a fault is detected in the distribution circuit, the power switching device is opened and the electrical connection is broken.

Various controllers and protective relays are used by the utility company to detect faults that occur in the distribution circuit. This most controllers use a microprocessor programmed to respond to the fault based on the type of fault and the type of power switching device connected to the controller. The controller may respond to a particular fault by causing the power switching device to open. Alternatively, upon the detection of a fault, the controller may cause the power switching device to open and close multiple times.

In order to make the most efficient switching in the distribution circuit and isolate the fault, the controllers need to monitor both the voltage present at the power switching device and electrical current flowing through the power switching device. If the amount of current exceeds a preprogrammed threshold for a certain period of time, the controller instructs the power switching device to perform the preprogrammed response. Should the fault continue to persist, the power switching device opens and remains open.

Monitoring the voltage levels at the power switching device is essential for determining, for example, the direction of power flow, if the power switching device is being backfed, or if the three phases of power are synchronized. Additionally, the utility personnel can use this information to monitor the output and efficiency of the distribution transformers providing power through the power switching devices. Presently, utility company personnel monitor voltage levels present at the power switching device by using dedicated potential transformers that are connected to the power switching devices. The controllers sample the output of the potential transformers and report this information to the craftsperson or other utility personnel. Voltage levels may be monitored at both the input connector and the output connector of the power switching device.

Using a dedicated potential transformer as a voltage measuring device is cumbersome and expensive because each voltage phase must be monitored separately. If voltage is measured at both connectors, two dedicated potential transformers are required per phase and there may not be enough room on the utility pole for each of the potential transformers. One solution is to use a voltage divider circuit connected to a conductor of a power device. The voltage divider circuit can be designed to include resistors or capacitors. Typically, the voltage drop over a divider load impedance (low voltage leg) is measured with respect to a voltage drop over a reference impedance (high voltage leg). From this ratio a value of the voltage potential is determined.

The use of a capacitive voltage divider in a power switching device to measure voltage is described in U.S. Pat. No. 4,074,193 ("the '193 patent"). The '193 patent discloses the use of a separate cylindrical conductor as an electrode forming in part the high voltage leg of a capacitive voltage divider. The corresponding voltage from the low voltage leg of the capacitive voltage divider is amplified and sent to a voltage potential measuring device, meter or controller.

The present invention eliminates the need for a separate dedicated conductor for the high voltage leg of the capacitive voltage divider. The present invention instead uses an existing shield of a current measuring device such as, for example, a transformer or Rogowski coil in the power switching device. The capacitive relationship between the shield and the high voltage conductor form the high voltage leg of the capacitive voltage divider. By using the existing shield, the cost of the separate conductor is eliminated. The present invention also allows the capacitive voltage divider to be tuned to thereby provide greater accuracy in measuring the voltage potential at the power switching device.

SUMMARY OF THE INVENTION

A method of determining a voltage potential on a conductor in a power switching device the method having the steps of:
  providing a current transformer housed in the power switching device, the current transformer having a shield, the shield in relation to the conductor forming a high voltage leg of a capacitive voltage divider;
  connecting the shield to a low voltage leg of a capacitive voltage divider; and,
  measuring the voltage potential across the low voltage leg.

A method of determining a voltage potential on a conductor in a power switching device, the method having the steps of:
  providing a coil housed in the power switching device, the coil having a shield, the shield in relation to the conductor forming a high voltage leg of a capacitive voltage divider,
  connecting the shield to a low voltage leg of the capacitive voltage divider, the low voltage leg having a plurality of capacitors,
  adjusting the capacitive voltage divider by removing at least one of the capacitors,
  measuring the voltage potential across the low voltage leg,
  determining a value of the voltage potential.

A voltage potential measuring circuit for use with a power switching device the circuit having:
  a coil, the coil surrounded by a shield,
  a conductor, the coil and the shield positioned around the conductor,
  a dielectric formed between the shield and the conductor such that the dielectric, the shield, and the conductor comprise a high voltage leg of a capacitive voltage divider and, a low voltage leg comprising one or more capacitors.

BRIEF DESCRIPTION OF THE DRAWINGS

The invention is further described in the detailed description that follows, by reference to the noted drawings by way of non-limiting illustrative embodiments of the invention, in which like reference numerals represent similar elements throughout the several views of the drawings, and wherein.

DETAILED DESCRIPTION OF ILLUSTRATIVE EMBODIMENTS

Figure 1:
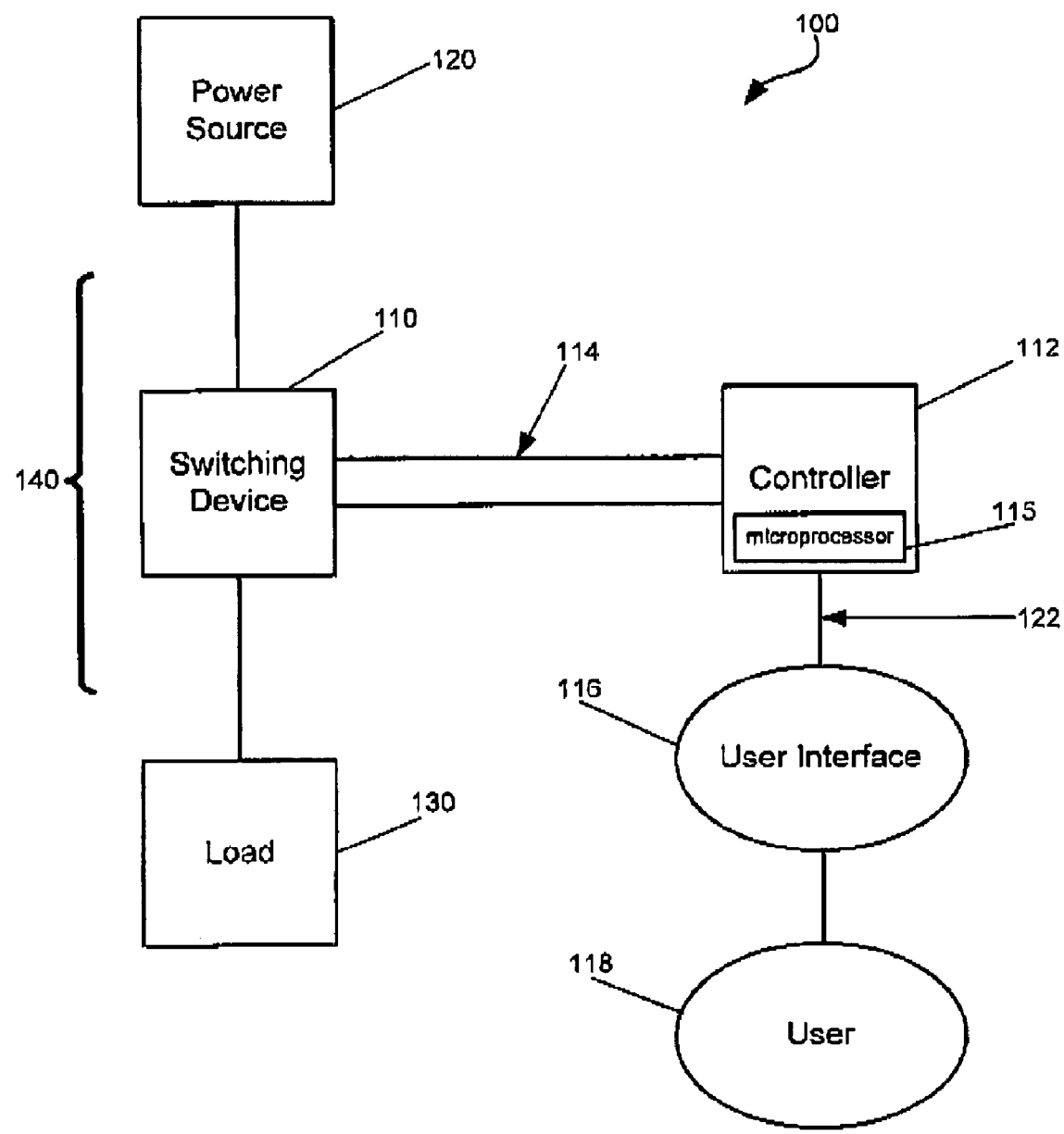
FIG. 1 illustrates a block diagram of a typical power switching configuration.

FIG. 1 shows a block diagram of a typical power switching configuration 100. The power switching configuration 100 has a power switching device 110 which is connected in series between a power source 120 and a load 130. The electrical circuit between the power source 120 and the load 130 is referred to as the power distribution circuit 140. The power switching device 110 is connected to a controller 112 by a bidirectional communications bus 114. A microprocessor 115 provides the controller 112 with the processing capability to monitor the power switching device 110 for faults as well as operating conditions. In the preferred embodiment, a Motorola HC12D60 microprocessor is used. A user 118 configures the controller 112 and receives information from the controller 112 via a user interface 116. The user interface 116 connects to the controller 112 through a communication means 122. The distribution circuit 140 is shown as a single phase of a three phase circuit for ease of illustration. The other two phases are identical.

The power switching device 110 connects the power source 120 to the load 130. A power source 120 used with the present invention is a substation that provides, for example, a 1 kilovolt(kV) up to 40 kV source of three phase AC power. An individual distribution transformer or bank of transformers connected together comprises the load 130. The transformers may be three phase transformers for large industrial applications or single phase transformers used to provide electricity to a residential consumer.

Three types of power switching devices 110 that utility companies use in the power switching configuration 100 are fault interrupters, breakers and reclosers. Each power switching device 110 performs a preprogrammed response when a fault condition in the power distribution circuit 140 is detected by the controller 112. For example, the fault interrupter opens once and remains open when a fault condition is detected. The breaker opens after a fault, but attempts to close before remaining open if the fault continues to exist. A recloser opens and closes multiple times when a fault condition exists. By opening and closing multiple times, the recloser attempts to clear the fault. Should the fault condition continue to exist, the recloser opens and remains open until reset manually. The recloser enters a "lock out" state when this occurs.

A fault condition occurs when one phase of power becomes shorted to ground, phases become shorted to each other, or when lightning strikes the distribution circuit 140. When a fault condition occurs, large amounts of current flow through the power distribution circuit 140. The controller 112 monitors the voltage and current levels communicated to it by the power switching device 110. The power switching device 110 sends this information to the controller 112 through the bidirectional communications bus 114. When an abnormal current level is detected by the controller 112, the controller 112 signals the power switching device 110 to execute the preprogrammed response. Two example controllers 112 used with the present invention are the ICD (Intelligent Control Device) and the PCD (Programmable Control Device), manufactured by ABB Inc.

A user 118 may be the utility craftsperson who is at the power switching device location. The craftsperson can use a laptop PC as the user interface 116 and connect directly to a serial port on the controller 112. The connection to the serial port is the communication means 122. Another user 118 may be the utility maintenance person remotely logged into the controller 112. In this example, the remotely located utility maintenance person uses a desktop PC for the user interface 116 and a modem configuration as the communication means 122 to connect to the controller 112.

Figure 2:
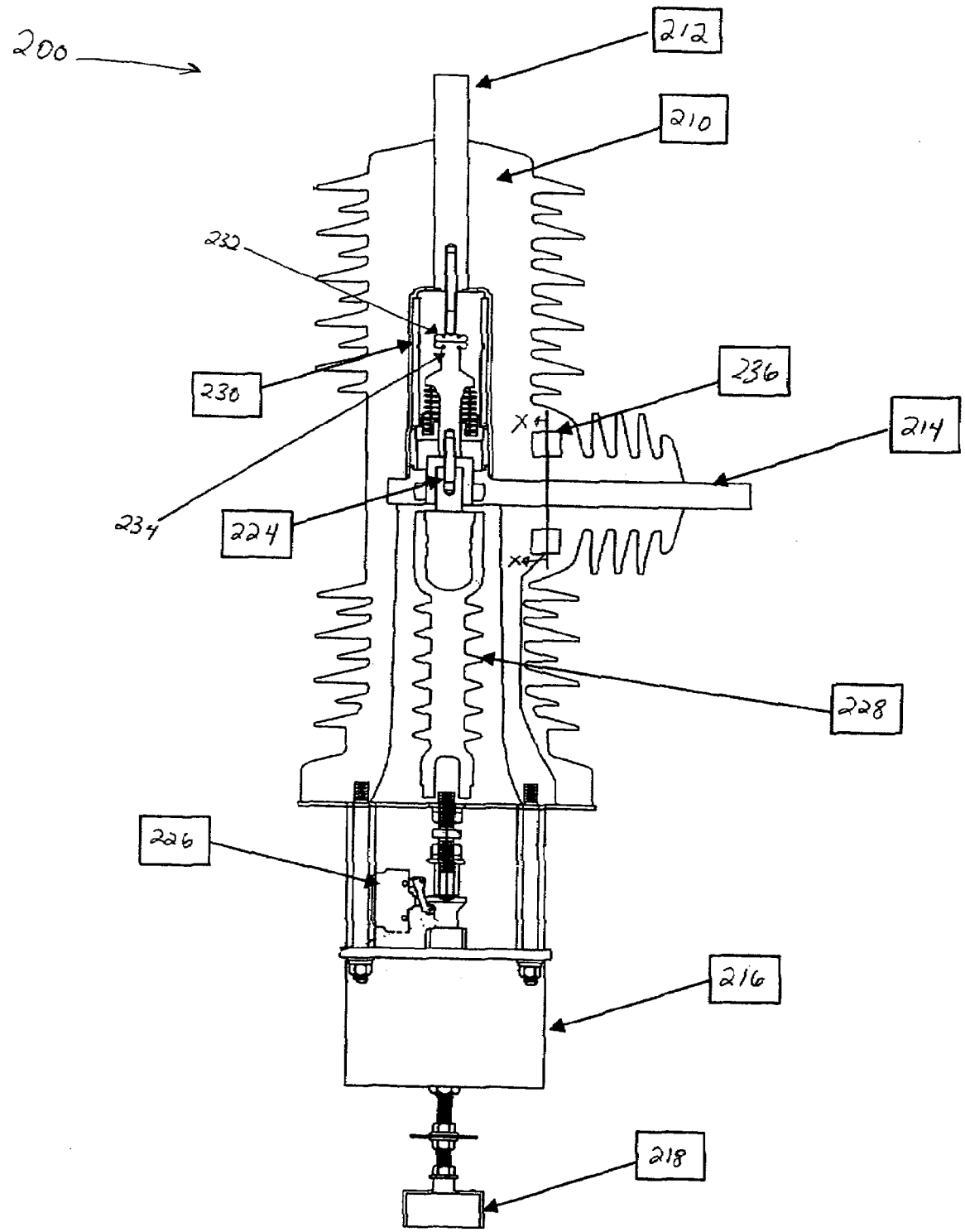
FIG. 2 illustrates a cross sectional view of a recloser used in the power generation and distribution industry.

A cross sectional view of a typical power switching device 110 in the form of a recloser 200 such as the OVR 1 Single Phase Recloser manufactured by ABB Inc. is illustrated in FIG. 2. Current flows through the recloser 200 from an H1 connector 212, through a vacuum interrupter 230 and a current transfer assembly 224 to an H2 connector 214. The vacuum interrupter 230 provides an enclosure that houses a stationary contact 232 and a moveable contact 234. The stationary contact 232 is directly connected to the H1 connector 212. The current transfer assembly 224 provides the electrical connection between the moveable contact 234 and the H2 connector 214.

Mounted around the H2 connector 214 is a current transformer 236. The current transformer 236 provides a current to the controller 112 that is proportional to the current flowing through the H2 connector 214. The controller 112 samples the proportional current and determines an appropriate value which is in turn conveyed to the user 118 through the user interface 116.

Figure 3:
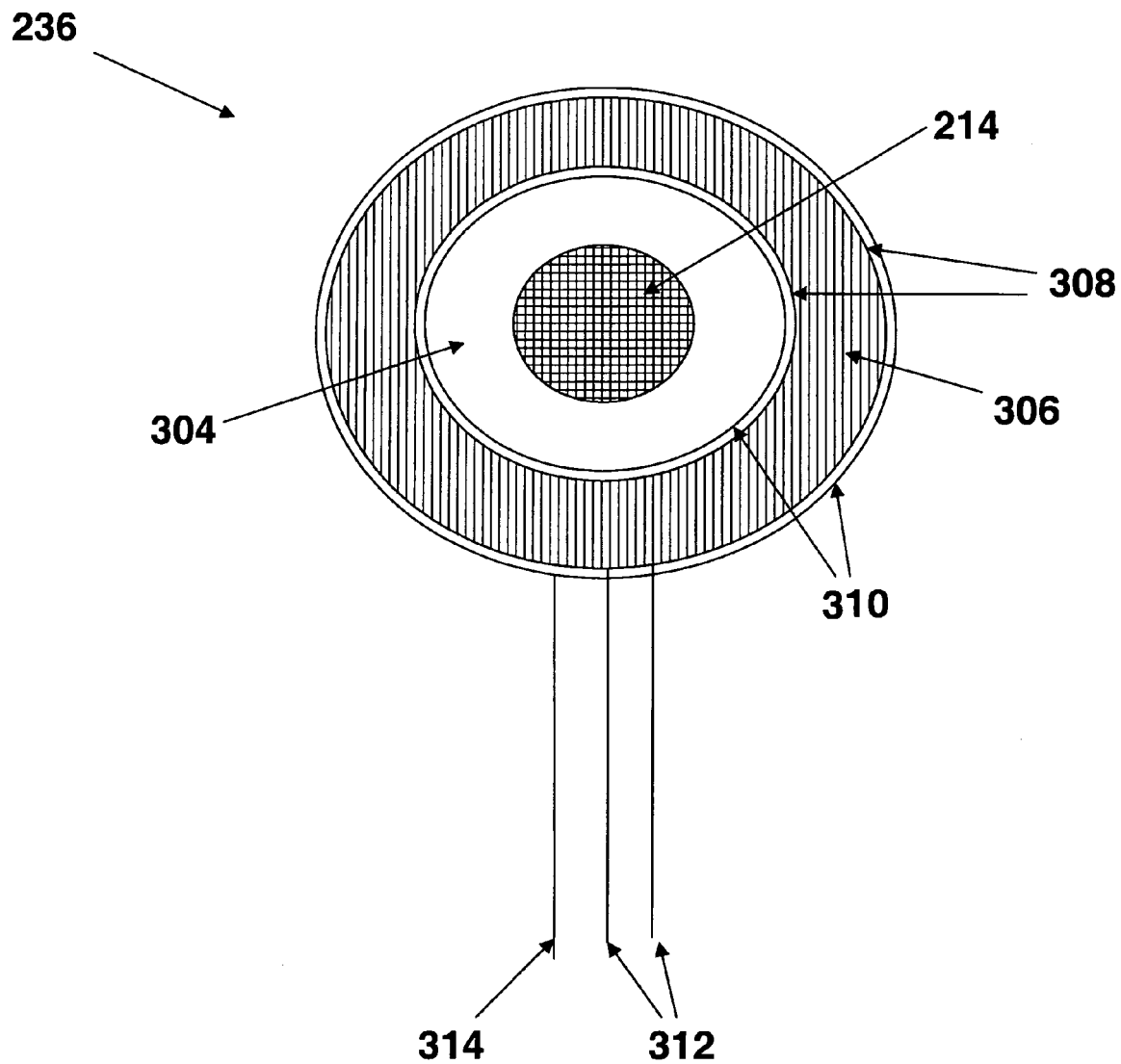
FIG. 3 illustrates an exploded cross sectional view of a current transformer installed in the power switching device.

A cross-sectional view of the current transformer 236 along the axis X-X of FIG. 2 is shown in FIG. 3. The current transformer 236 has wire wound around an annular shaped ferrous core 306 to form a winding 308. The winding 308 and magnetic core 306 are encased in an electrostatic shield 310. In one embodiment, conductive tape or semi-conductive tape is used for the electrostatic shield 310. In another embodiment, the electrostatic shield is an aluminum coating applied to the core 306 and winding 308. In between the H2 connector 214 and the current transformer 236 is a layer of filler material 304 such as epoxy or polyurethane. This is the same material that is used for the housing 210 of the recloser 200.

The current transformer 236 is electrically connected to the bidirectional communications bus 114 by the two winding leads 312 and the shield lead 314. The winding leads 312 are connected to the winding 308 and the shield lead 314 is connected to the shield 310. The bidirectional communications bus 114 routes the electrical signals from the winding leads 312 and the shield lead 314 to the controller 112 for processing. Inside the controller 112, the signals from the winding leads 312 are connected to a current sensing circuit (not shown) and the signal from the shield lead 314 is connected to a capacitive voltage divider circuit 400, one embodiment of which is shown in FIG. 4.

The layer 304 between the current transformer 236 and the H2 conductor 214 provides a consistent and predictable dielectric property between the shield 310 and the H2 connector 214. The combination of the shield 310, the layer 304, and the H2 connector 214 form a capacitor C1 which is shown in the schematic of FIG. 4. The capacitor C1 forms a high voltage leg of the capacitive voltage divider 400. In the previously described OVR-1 recloser 200, the capacitance of C1 is approximately 30-50 pF.

Figure 4:
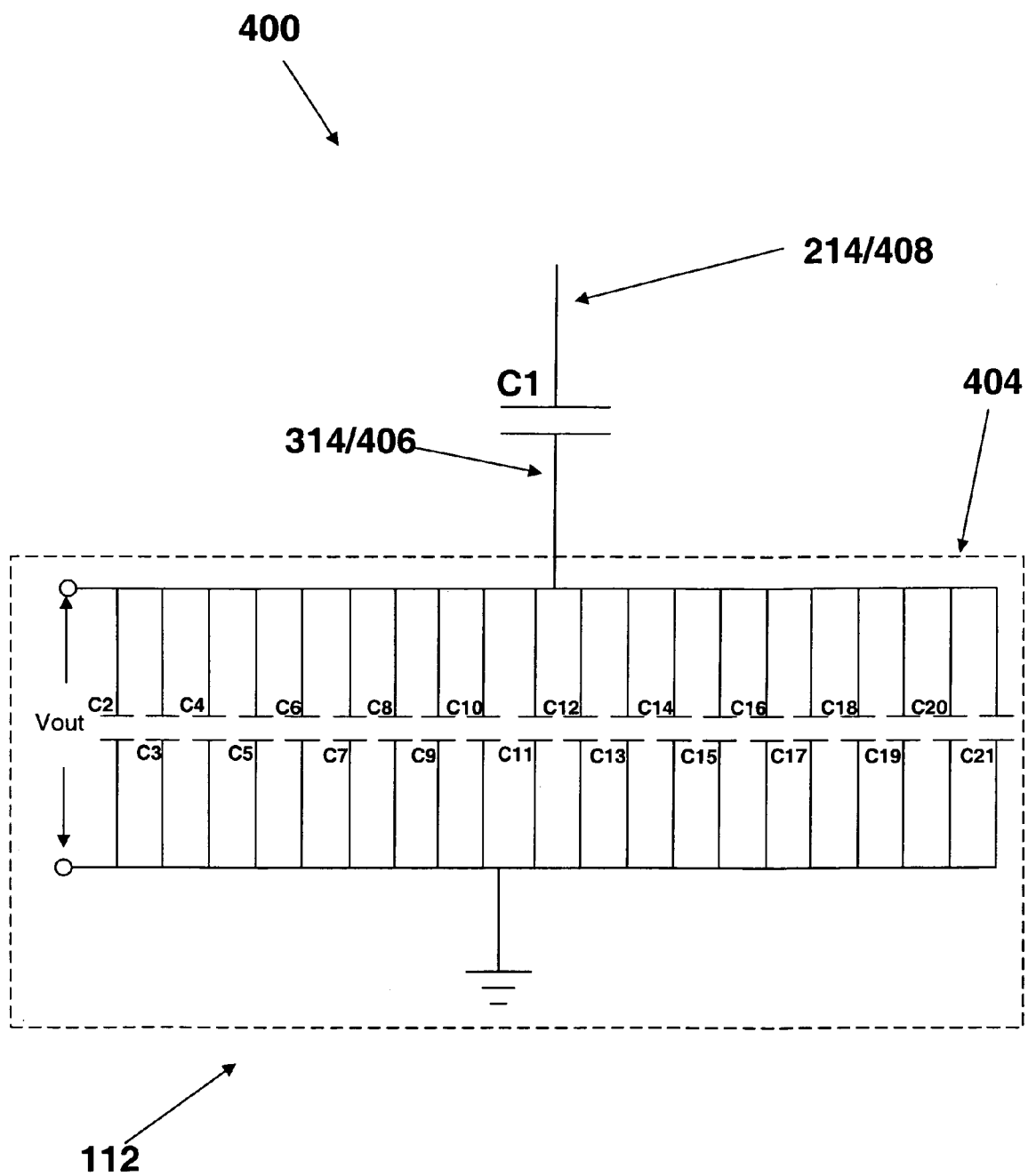
FIG. 4 illustrates a schematic diagram of a capacitive voltage divider circuit in accordance with one embodiment of the present invention.

As shown in FIG. 4, the shield lead 314 connects to the low voltage leg 404 of the capacitive voltage divider 400. In this embodiment, the low voltage leg 404 comprises individual capacitors C2-C21, which are connected between the shield 310 and ground. Removing one or more of the capacitors C2-C21 allows the capacitive voltage divider 400 to be tuned. This is explained in further detail in subsequent sections. Alternatively, should the capacitive voltage divider 400 not need to be adjusted, the capacitors C2-C21 may be combined into one single capacitor.

Within the controller 112, the output voltage $V_{out}$ across the low voltage leg 404 is sent to an amplification stage (not shown) and then to an analog to digital converter circuit stage (not shown). In a preferred embodiment, the microprocessor 115 has several built-in A/D converters which are connected to the amplification stage. The microprocessor 115 determines the appropriate voltage potential value from the output of the A/D converter and that value is displayed to a user 118 via the user interface 116.

In a preferred embodiment, the capacitors C2-C21 of the low voltage leg 404 are mounted on a printed circuit board (not shown) within the controller 112 and are easily accessible by manufacturing personnel or a craftsperson. In this embodiment, the capacitors C4-C21 may be removed by breaking or cutting them off the printed circuit board while capacitors C2 and C3 are not removable. Removing one or all of the capacitors C4-C21 reduces the total capacitance of the low voltage leg 404 and increases the value of the output voltage $V_{out}$. The values of the capacitors C4-C21 are chosen to allow the capacitive voltage divider 400 to be tuned with as much granularity as possible. In one exemplary capacitive voltage divider 400 based on the capacitance of C1 being approximately 40 pF, the capacitance for each of capacitors C2-C21 and the percent change in $V_{out}$ resulting from removal of each of capacitors C4-C21 are shown in the table below.

| Capacitors | Value | Percentage Change |
| --- | --- | --- |
| C2, C3 | 0.1 µF | Non-Removable |
| C4-C7 | 0.033 µF | 7.5% |
| C8-C15 | 0.01 µF | 2% |
| C16-21 | 3300 pF | .76% |

The voltage divider 400 is tuned to account for any variance in the capacitance of the high voltage leg C1. For the embodiment of FIG. 4, the tuned capacitance ratio of the low voltage leg 404 to the high voltage leg C1 is approximately 10,000:1. This ratio was chosen to provide the controller circuitry (amplification stage and A/D conversion stage) with an AC voltage within a sampling area. Those skilled in the art appreciate that this ratio is also a de-facto industry standard. As an illustrative example, should the low voltage leg 404 of the capacitive voltage divider 400 need to be tuned down by 18.5%, capacitors C4, C5, C8, C16 and C17 are removed and the output voltage $V_{out}$ increases by 18.5%.

As discussed previously, the capacitors C4-21 within the controller 112 are accessible to manufacturing or utility personnel. During the manufacturing and assembly process, the controller 112 may be paired with a power switching device 110. In this case, the capacitive voltage divider circuitry 400 may be adjusted for the unique capacitance value C1 of the power switching device 110 prior to shipment. The manufacturing person measures the capacitance of C1 and then removes the appropriate capacitors C4-C21 to achieve the 10,000:1 ratio. If the controller 112 is shipped to the field separately, the utility craftsperson may tune the voltage divider 400 at the installation site performing the same steps prior to bringing the power switching device 110 on line.

The present invention may also be applied to power switching devices 110 using other types of shielded coils for use in measuring current and voltage, such as shielded Rogowski coils. Those skilled in the art appreciate that the Rogowski coil is an air core toroidal coil placed around a conductor. The core of the Rogowski coil is constructed of a non-ferrous material. An alternating magnetic field within the coil, produced by the current flowing in the conductor, induces a voltage which is proportional to the rate of change of the current. The output of the Rogowski coil is sent to an integrator where the value of voltage is extrapolated. The voltage measured with the Rogowski coil is a function of the amount of current flowing through the power switching device 110.

While the Rogowski coil is not shown in any of the drawing figures, FIG. 4 does show the shield lead 406 of the Rogowski coil and the conductor 408 around which the air core toroidal coil of the Rogowski coil is placed. The capacitor C1 of circuit 400 is formed from the combination of the shield of the Rogowski coil, the conductor 408 and the air core there between. In this embodiment, the air core is the dielectric of capacitor C1. The low voltage leg 404 of the capacitive voltage divider 400 is designed with the appropriate values for capacitors C2-C21 to provide the preferred ratio of 10,000:1. The present invention measures the voltage potential at the conductor 408 independent of the amount of current flowing through the power switching device 110.

It is to be understood that the foregoing description has been provided merely for the purpose of explanation and is in no way to be construed as limiting of the invention. Where the invention has been described with reference to embodiments, it is understood that the words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

What is claimed is:

1. A voltage potential measuring apparatus for measuring voltage in a conductor, the measuring apparatus comprising:
    a current measuring device positioned around the conductor;
    an electrostatic shield encapsulating said current measuring device;
    a dielectric located between said shield and said conductor such that said dielectric, said shield and said conductor form a first capacitor; and a second capacitor electrically connected to said shield, wherein a voltage is measured across said second capacitor.

2. the voltage potential measuring apparatus of claim 1 wherein said dielectric includes a filler material.

3. The voltage potential measuring apparatus of claim 2 wherein said filler includes epoxy or polyurethane.

4. The voltage potential measuring apparatus of claim 1 wherein said electrostatic shield includes a conductive tape or semi-conductive tape.

5. The voltage potential measuring apparatus of claim 1 wherein said electrostatic shield comprises an aluminum coating.

6. The voltage potential measuring apparatus of claim 1 wherein said current measuring device is a current transformer adapted to measure the current flowing through the conductor.

7. The voltage potential measuring apparatus of claim 1 wherein said first capacitor and said second capacitor form a voltage divider.

8. The voltage potential measuring apparatus of claim 7 wherein said first capacitor forms a high voltage leg of said voltage divider and said second capacitor forms a low voltage leg of said voltage divider.

9. The voltage potential measuring apparatus of claim 1 wherein said current measuring device includes a Rogowski coil.

10. The voltage potential measuring apparatus of claim 1 wherein said current measuring device includes a core and winding.

11. A method of determining a voltage potential on a conductor in a power switching device comprising:
providing a current measuring device housed in said power switching device, said current measuring device surrounding the conductor and adapted to measure current flow in the conductor,
providing an electrostatic shield encapsulating said current measuring device, said shield in spaced relationship from the conductor to form a first capacitor,
electrically connecting said shield to a second capacitor, and
measuring the voltage potential across said second capacitor.

12. The method of claim 11 further comprising displaying the voltage potential to a user.

13. The method of claim 11 wherein said first capacitor and said second capacitor form a voltage divider.

14. The method of claim 13 wherein said first capacitor forms a high voltage leg of said voltage divider and said second capacitor forms a low voltage leg of said voltage divider.

15. The method of claim 11 wherein said current measuring device comprises a Rogowski coil.

16. The method of claim 11 wherein said current measuring device comprises a core and a winding.

* * * * *